United States Patent [19]
Washburn et al.

[11] Patent Number: 4,999,583
[45] Date of Patent: Mar. 12, 1991

[54] AMPLIFIER DRIVE CONTROLLER

[75] Inventors: Robert D. Washburn, Malibu; Robert F. McClanahan, Valencia; Robert S. Wedeen, Manhattan Beach, all of Calif.

[73] Assignee: Hughes Aircraft Company, Los Angeles, Calif.

[21] Appl. No.: 486,574

[22] Filed: Feb. 28, 1990

[51] Int. Cl.$^5$ .............................................. H03G 3/30
[52] U.S. Cl. ...................................... 330/86; 330/282; 330/284; 455/116; 455/126
[58] Field of Search ................. 330/86, 282, 112, 144, 330/145, 284; 455/116, 126; 375/59

[56] References Cited
U.S. PATENT DOCUMENTS
4,709,215 11/1967 McClannahan et al. ......... 330/86 X

*Primary Examiner*—James B. Mullins
*Attorney, Agent, or Firm*—Leonard A. Alkov; W. K. Denson-Low

[57] ABSTRACT

An amplifier drive control circuit having a power combiner for combining an RF input signal with a feedback signal to provide a composite RF signal, a power control circuit for providing a selectively attenuated replica of the composite RF signal to the input of the amplifier, and feedback circuitry connected between the output of the amplifier and the power combiner for providing a level controlled portion of the output of the amplifier as the feedback signal. The power control circuit selectively attenuates the replica of the composite RF signal when the power of the composite RF signal exceeds a predetermined threshold, while the feedback circuitry controls the level of the feedback signal as a function of the gain of the amplifier as determined by the level of the composite RF signal and the level of the amplifier output. The feedback circuitry includes a feedback phase control circuit for controlling the phase of the feedback signal relative to the input to the amplifier.

3 Claims, 6 Drawing Sheets

PIN DRIVER

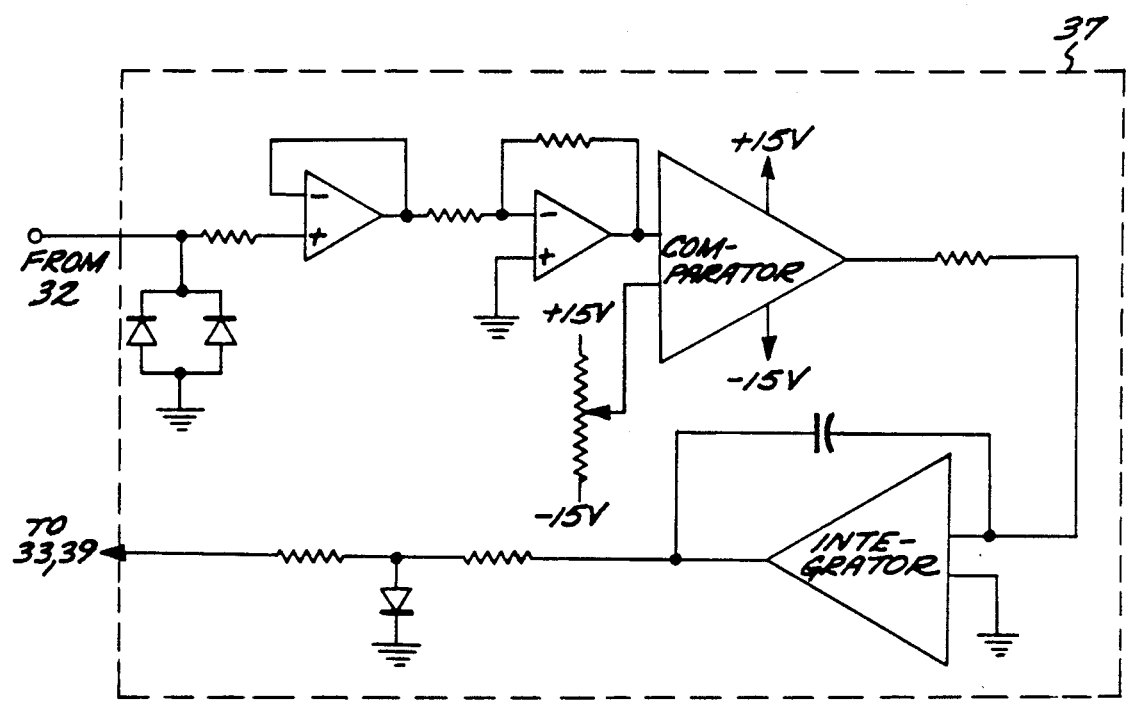
FIG.8
FIG.9
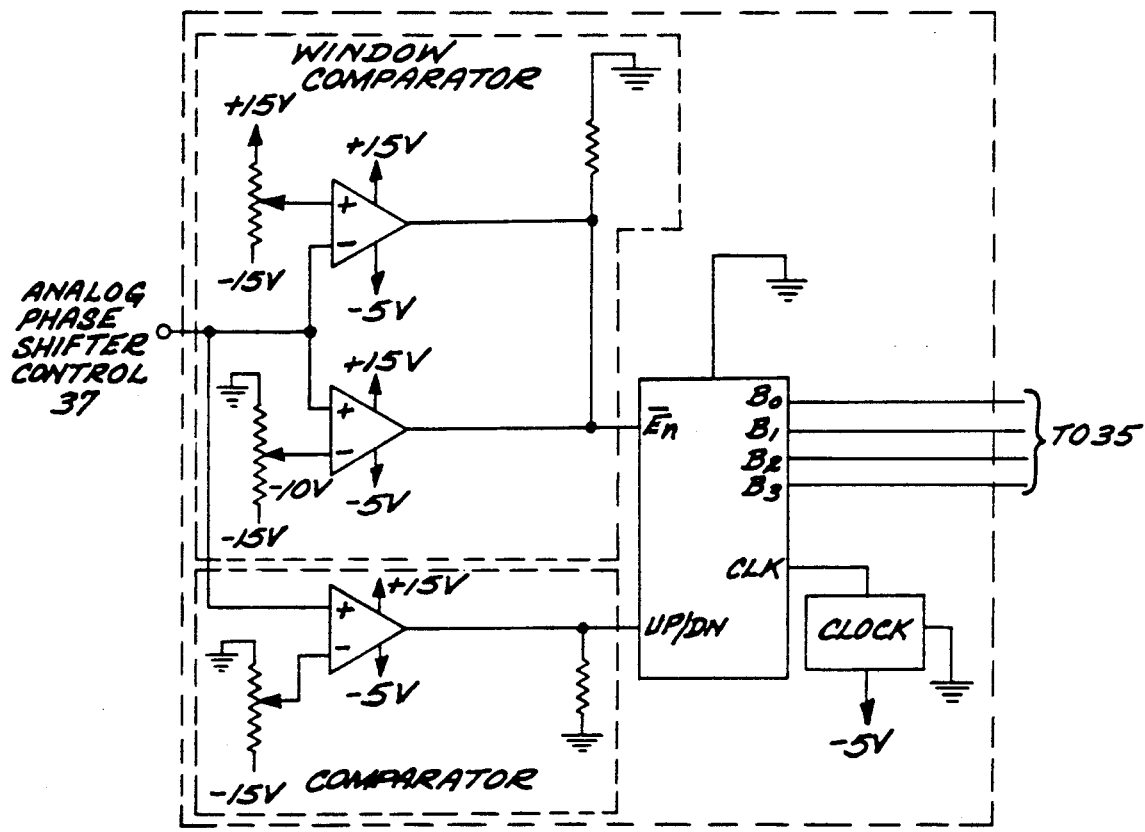

4,999,583

AMPLIFIER DRIVE CONTROLLER

BACKGROUND OF THE INVENTION

The present invention is directed generally to feedback control circuitry for RF amplifiers, and is directed more particularly to a positive feedback control circuit for RF amplifiers.

RF solid state power amplifiers, such as those utilized in radar transmitters, require several stages of preamplification in order to provide sufficient gain in many applications. Considerations with the use of preamplification stages include reduced efficiency and additional complexity.

U.S. Pat. No. 4,709,215 discloses amplifier control circuitry that utilizes positive feedback to increase the effective gain of a traveling-wave-tube (TWT) amplifier. However, a consideration with the circuitry of U.S. Pat. No. 4,709,215 is the possibility of over driving the TWT when the gain of the TWT decreases with increasing input power.

SUMMARY OF THE INVENTION

It would therefore be an advantage to provide a feedback control circuit for an RF power amplifier which provides positive feedback and which prevents the amplifier form being overdriven as a result of increased feedback when the amplifier gain decreases with increasing RF input power.

The foregoing and other advantages are provided in a drive control circuit that includes a power combiner for combining an RF input signal with a feedback signal to provide a composite RF signal, a power control circuit for providing a selectively attenuated replica of the composite RF signal as the input to the amplifier, feedback circuitry for providing a portion of the amplifier output as the feedback signal, and a feedback attenuator for controlling the level of the feedback signal as a function of the gain as determined by the level of the composite RF signal and the level of the amplifier output. The power control circuit provides attenuation of the composite input RF when the composite RF signal exceeds a predetermined threshold.

BRIEF DESCRIPTION OF THE DRAWING

The advantages and features of the disclosed invention will readily be appreciated by persons skilled in the art from the following detailed description when read in conjunction with the drawing wherein:

FIG. 8 is a schematic diagram of the analog phase shift control circuit of the compensation circuit in FIG. 1.

FIG. 9 is a schematic diagram of the digital phase shift control circuit of the compensation circuit in FIG. 1.

DETAILED DESCRIPTION OF THE DISCLOSURE

Overview

Figure 1:
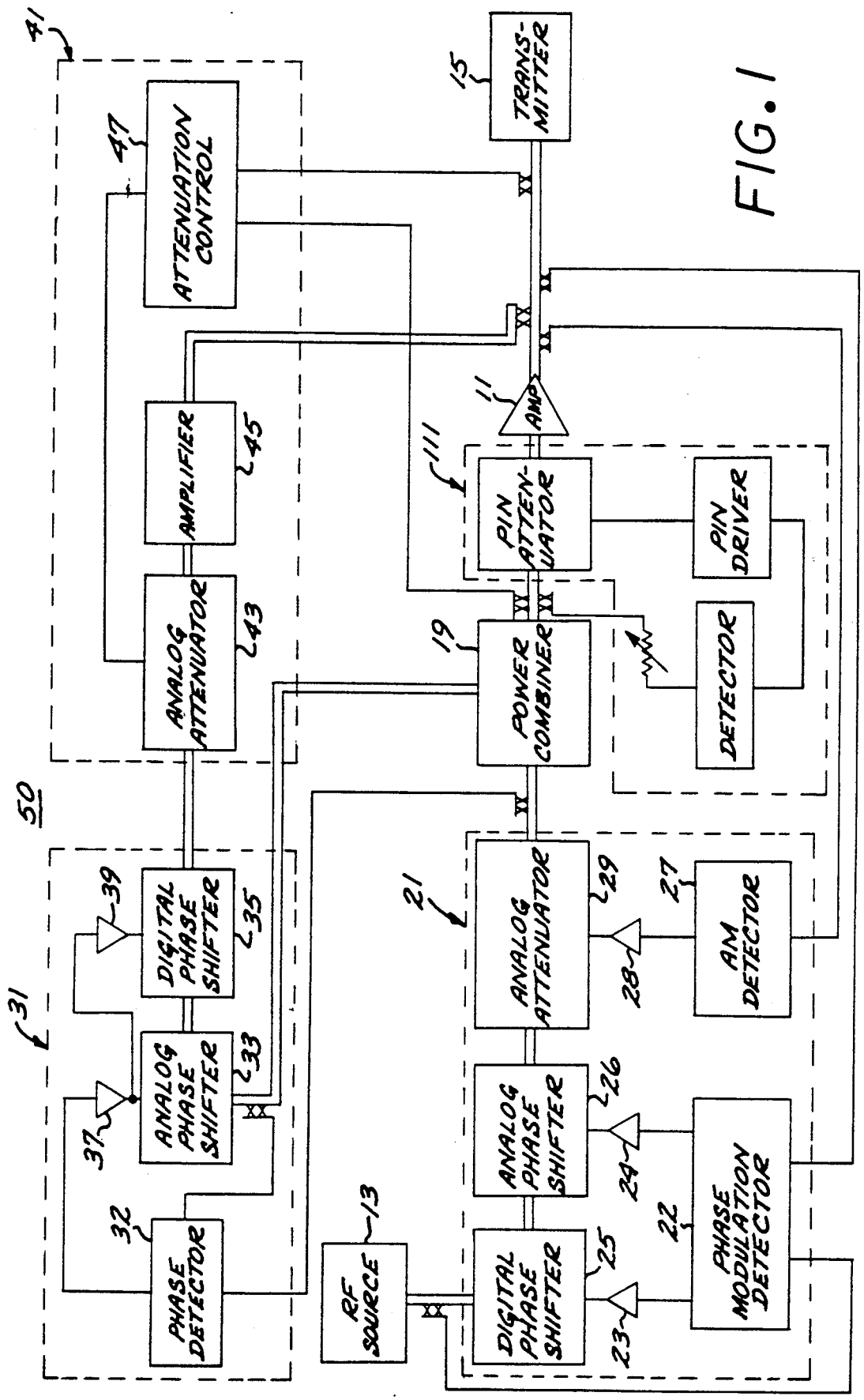
FIG. 1 is a schematic drawing of an exemplary amplifier drive control circuit incorporating the present invention.

In the following detailed description and in the several figures of the drawing, like elements are identified with like reference numerals.

The detailed description set forth below in connection with the appended drawings is intended merely as a description of a presently preferred embodiment of the invention, and is not intended to represent the only form in which the present invention may be constructed or utilized. The description sets forth the functions and sequence of events that are affected by the invention in connection with the illustrated embodiment. It is to be understood, however, that the same, or equivalent functions and sequences may be accomplished by different embodiments that are also intended to be encompassed within the spirit and scope of the invention.

As described herein, the present invention increases the effective gain of a solid state power amplifier and therefore eliminates the need for preamplifier stages. Such increase in effective gain is achieved through utilization of gain regulated positive feedback from the amplifier output to augment the RF input to the amplifier. The amplifier thus drives itself such that its output power feeds back and adds to the small RF input power from an RF source, thereby producing a greater RF input power and hence a greater RF output power than would be achievable without feedback.

In accordance with the invention, the output power of the amplifier is compared with the input power, and the resulting gain indication is utilized to control the gain or attenuation in the feedback loop such that the feedback loop gain is kept slightly below unity at all drive levels and frequencies. Under those conditions, an RF source with a relatively low power level can be amplified up to the compression point of the amplifier with only one stage of amplification.

As the output power of the solid state amplifier increases, its gain decreases which decreases the loop gain. In order to maintain the loop gain close to unity, the present invention increases the positive feedback which drives the amplifier further into compression, which decreases its gain even more. The decrease in gain causes more feedback, which in turn decreases gain. Ultimately, the increase in positive feedback due to decreasing gain can drive the amplifier power beyond the safe operating limit of the amplifier. In accordance with the invention, an RF power control circuit is provided to limit the feedback power such that amplifier power remains below its maximum safe operating level. The amplifier can be operated in its linear region or in compression by adjustment of the RF power control circuit threshold which determines the input power level at which the feedback signal is attenuated.

In order to achieve positive feedback, the feedback power must combine in phase with the input power, and the invention utilizes automatic phase control in the feedback network so that the feedback power is phase locked to the input power. Such phase control is provided by an analog phase shifter and a digital phase shifter.

General Circuit Description

Referring to FIG. 1 of the drawings, an overall circuit diagram is illustrated therein for controlling the operation of an amplifier 11, which by way of illustrative example is a solid state power amplifier. In general, a signal from the RF source 13 is communicated to power combiner 19 to drive the amplifier 11. The output from amplifier 11 is then communicated, for example, to a transmitter 15.

Noise control circuit 21 illustrated in more detail at FIGS. 2, 3, 4a and 4b utilizes any of a number of commercially available designs adapted to condition the signal from the RF source 13 by means of negative feedback from the output of amplifier 11. The noise control circuit 21 opposes noise in the signal to amplifier 11 attributable to spurious phase or amplitude modulation.

In the presently preferred embodiment, noise control circuit 21 includes phase modulation detector 22, connected to the RF source 13 and the output of amplifier 11. Phase modulation detector 22 is described more fully in connection with FIG. 2. When the RF source and amplifier output signals are out-of-phase, the phase modulation detector 22 generates a difference signal to controllers 23 and 24, that in turn regulates the operation of digital phase shifter 25 and analog phase shifter 26. Both digital phase shifter 25 and analog phase shifter 26 are adapted to vary the phase of the signal communicated from the RF source 13 to the amplifier 11, such that the output of the amplifier 11 is some whole integer times 360° the phase of the signal from the RF source 13, i.e., the signal from the RF source 13 and the output from amplifier 11 are effectively phase locked. Controller 23 may comprise emitter coupled logic integrated circuits such as the 1650 and the 1674, and either a model 0104 or 1662 an 1688, for the AND functions. Controller 24 may be comprised of a LH0032 amplifier, a LH0033 buffer, and a shottky diode such as HD1006. Digital phase shifter 25 is preferably adapted to provide course phase adjustments and analog phase shifter 26 provides more finely turned phase adjustments within the incremental region to which digital phase shifter 25 corrects. In the presently preferred embodiment, phase detector 22 may comprise commercially available devices such as in phase and quadrature power splitters with double balanced mixers such as Watkins & Johnson, model M31A. Digital phase shifter 25 may be implemented as a Planar Microwave PCA0025 model and analog phase shifter 26 may be implemented as a Triangle PQ1151 model.

Figure 3:
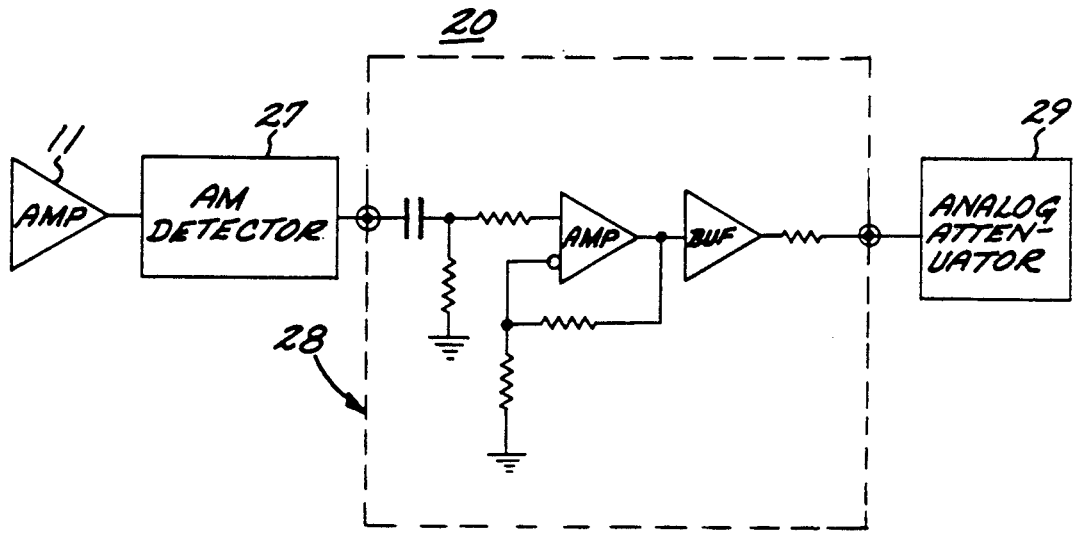
FIG. 3 is a schematic diagram of the amplitude modulation control circuit of FIG. 1.

Amplitude modulation noise control circuit 20, shown at FIG. 3, includes detector 27 and controller 28. Noise circuit 20 forms a portion of noise control circuit 21, and is also connected to the input and output of the amplifier 11. Upon detection of variations in the signal amplitude output from amplifier 11, the AM detector 27 communicates a signal to controller 28 that regulates the operation of analog attenuator 29, to increase or decrease the attenuation of the signal from the RF source 13 to the amplifier 11, i.e., the amplifier input signal. Detector 27, controller 28 and analog attenuator 29 operate as a negative feedback circuit adapted to oppose amplitude modulation of the signal from RF source 13 by selective introduction of an opposing, out-of-phase signal derived from the output of the amplifier 11. In the presently preferred embodiment, AM detector 27 may be implemented as an Omni Spectra model 2086-6000-013, controller 28 may be implemented in the same manner as controller 24, and analog attenuator 29 may be implemented as an Anaran 60368 model.

Despite the attenuation and phase correction affected by noise control circuit 21, the amplifier 11 may be induced to operate outside of the saturation region as consequence of factors such as rapid frequency modulation of the RF source, pulsing of the output load, etc. In order to correct for such variations in the operation of the amplifier 11, a compensation circuit 50 is provided across the input and the output of the amplifier 11.

Figure 5:
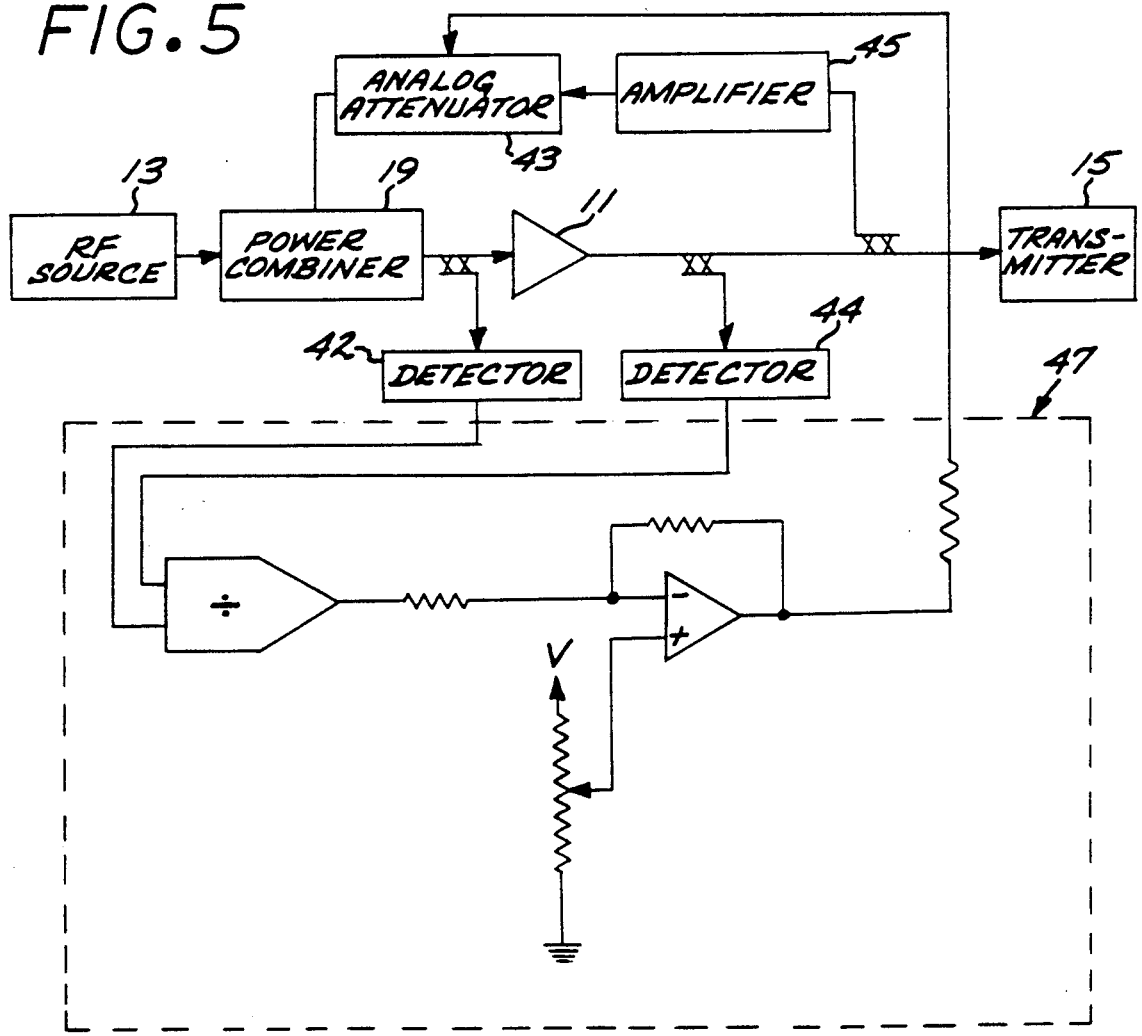
FIG. 5 is a schematic representation of the amplifier feedback attenuation control circuit of FIG. 1.

The compensation circuit 50, shown in more detail in FIG. 5, is implemented as an attenuation control circuit 41 and phase control circuit 31. Attenuation control circuit 41 includes analog attenuator 43 and attenuator control 47. In general, the attenuation control circuit 41 operates to tap a portion of the output power from the amplifier 11, which is then fed back to power combiner 13 at the input to amplifier 11 to effect gain regulated positive feedback to drive the amplifier into saturation. The attenuation control circuit 41 selectively varies the amplitude of the feedback signal so as to maintain the amplifier 11 in a saturated operating condition.

An RF power control circuit 111 is provided to protect the amplifier 11 by limiting the maximum input power thereto. The RF power control circuit 111 comprises a directional coupler, a variable attenuator, a detector, a PIN driver and a PIN attenuator. When the input power exceeds a predetermined level, the detector output voltage causes the PIN driver to increase the PIN attenuation so that the input power to the amplifier decreases. The predetermined input power level, above which the PIN attenuator starts to show an increased level of attenuation, can be controlled by adjusting the variable attenuator or by adjusting the gain of the PIN driver circuit.

Noise Reduction Circuit

Figure 2:
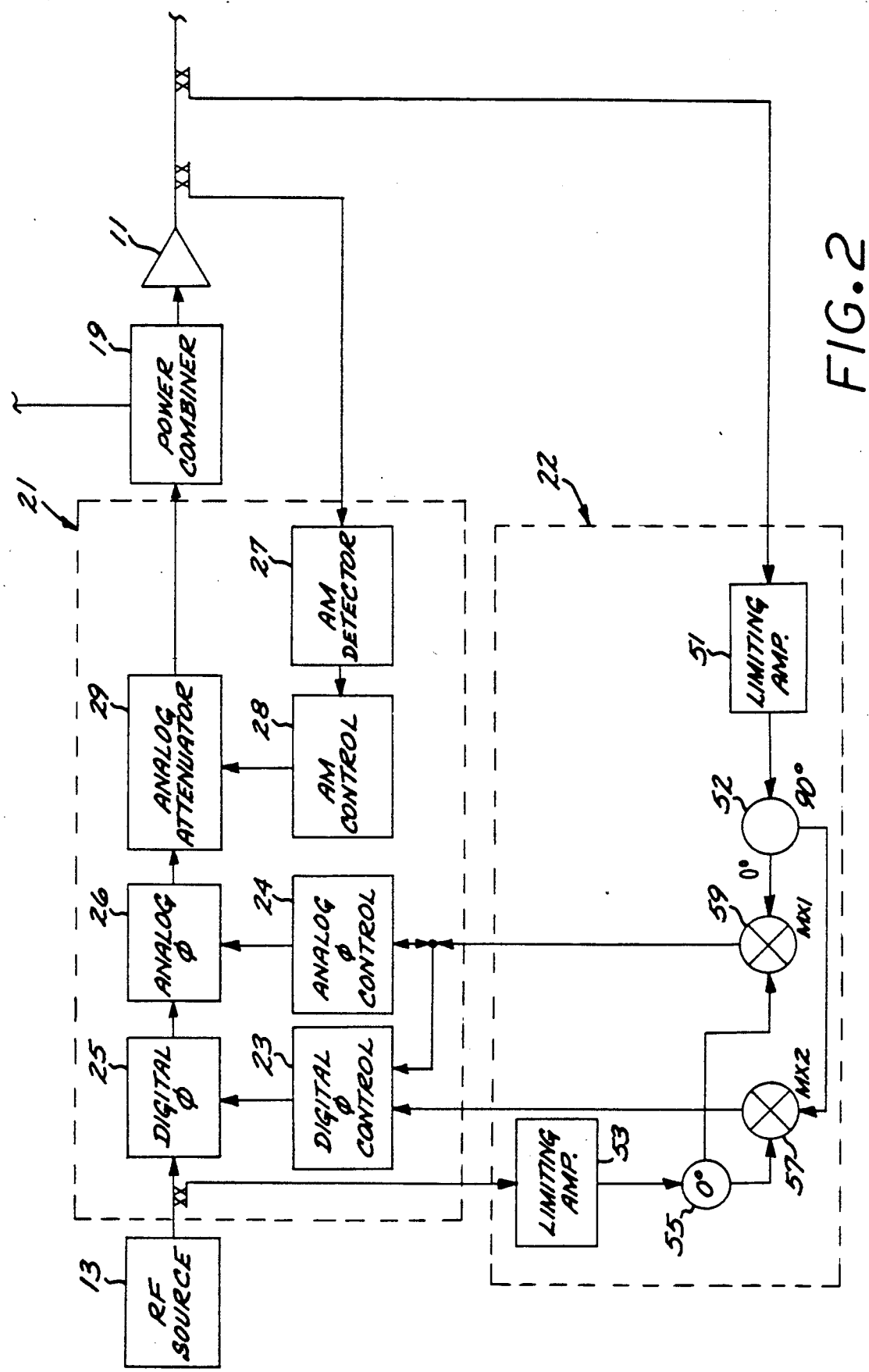
FIG. 2 is a schematic diagram of a portion of the circuitry of FIG. 1, further detailing the noise control circuitry.

FIG. 2 illustrates a portion of the circuit of FIG. 1, with further detail provided of an exemplary noise control circuit 21, particularly phase modulation detector 22. The noise reduction circuit 21 is comprised of power splitters and mixers for phase detection, limiting amplifiers to detect only the phase difference independent of the amplitude of the signal, analog and digital phase shifters for effecting the variable phase shift, and control electronics for regulating the operation of the phase shifters in response to the mixers outputs.

FIG. 2 illustrates the circuit elements and their inner connections. The input and output of the amplifier 11 are sampled, then go through optional limiting amplifiers 53 and 51, respectively, for insuring a constant amplitude signal and then split in two signals. The sampled input power is split by the in phase power splitter 55, while the sampled output power is split into 0° and 90° quadrature components by off phase power splitter 52.

As shown at FIG. 2, the output of the amplifier 11 is coupled to limiting amplifier 51. The output of limiting amplifier 51 is split into quadrature components by off phase power splitter 52. The in-phase output of the power splitter 52 is provided to mixer 59, and the 90° output of the power splitter 52 is provided to mixer 57. The output of RF source 13 is communicated to mixers 57 and 59 via limiting amplifier 43 and in phase power splitter 55. Thus, the output of the RF source 13 is compared (a) to the output of the amplifier 11 by mixer 59, and (b) to the 90° phase shifted output of the amplifier 11 by mixer 57. The comparison between the signal from RF source 13 and the signals from the output of off phase power splitter 52 is operative to generate signals that serve as inputs to digital phase controller 23, shown in more detail at FIG. 4A, and analog phase controller 24, shown in more detail at FIG. 4B. Digital phase controller 23 and analog phase controller 24 in turn control the operation of digital phase shifter 25 and analog phase shifter 26, respectively.

Since the phase difference between the inputs to the mixer 57 is 90 degrees greater than the phase difference between the inputs to the mixer 59, it becomes relatively simple to determine the variation of mixer voltage, resulting from the amount of phase difference between the amplifier 11 input and output voltages.

Generally, the output voltage of the mixers can be written as:

$V_{if} = -V \cos(\phi + \phi_1)$, $V_{if}$ = mixer output voltage $V$ = constant $\phi$ = phase difference between the mixed signals at identical frequencies and constant amplitude $\phi_1$ = a phase constant appropriate for the particular mixer.

The relationship between the voltage at the inputs to digital phase controller 23 and the phase difference is set forth in Table I, where $V_{IF1}$ = signal derived from output of mixer 59, and $V_{IF2}$ = signal derived from output of mixer 57.

TABLE I

| Phase Difference ($\emptyset$) In Degrees | Mixer Output Voltage Polarity | |
|---|---|---|
| $0 < \emptyset < 90$ | $V_{IF1} < 0$ | $V_{IF2} < 0$ |
| $90 < \emptyset < 180$ | $V_{IF1} > 0$ | $V_{IF2} < 0$ |
| $180 < \emptyset < 270$ | $V_{IF1} > 0$ | $V_{IF2} > 0$ |
| $270 < \emptyset < 360$ | $V_{IF1} < 0$ | $V_{IF2} > 0$ |

Knowing the relationship between the phase difference and the mixer output voltage, the phase shift between amplifier input and output voltages may be determined by examining the polarity of the output voltages from mixers 57 and 59. For example, if $V_{IF1}$ and $V_{IF2}$ are both negative, the phase difference between amplifier input and output signals is between 0° and 90°, and the amount of phase shift needed is between 270° and 360°. In such a case, a coarse phase shift of 270° can safely be made independent of the precise phase difference.

The relationship between the polarity of the signals $V_{IF1}$ and $V_{IF2}$, from mixers 57 and 59, in comparison to the phase shift needed, is set forth in Table II. Referring to Table II, a "1" is used to indicate a positive voltage, and "0" is used to indicate a negative voltage.

TABLE II

| Phase Shift Needed | Min. Phase Shift | $V_{IF1}$ | $V_{IF2}$ |
|---|---|---|---|
| $270 < \emptyset < 360$ | 270 | 0 | 0 |
| $180 < \emptyset < 270$ | 180 | 1 | 0 |
| $90 < \emptyset < 180$ | 90 | 1 | 1 |
| $0 < \emptyset < 90$ | 0 | 0 | 1 |

Figure 4A:
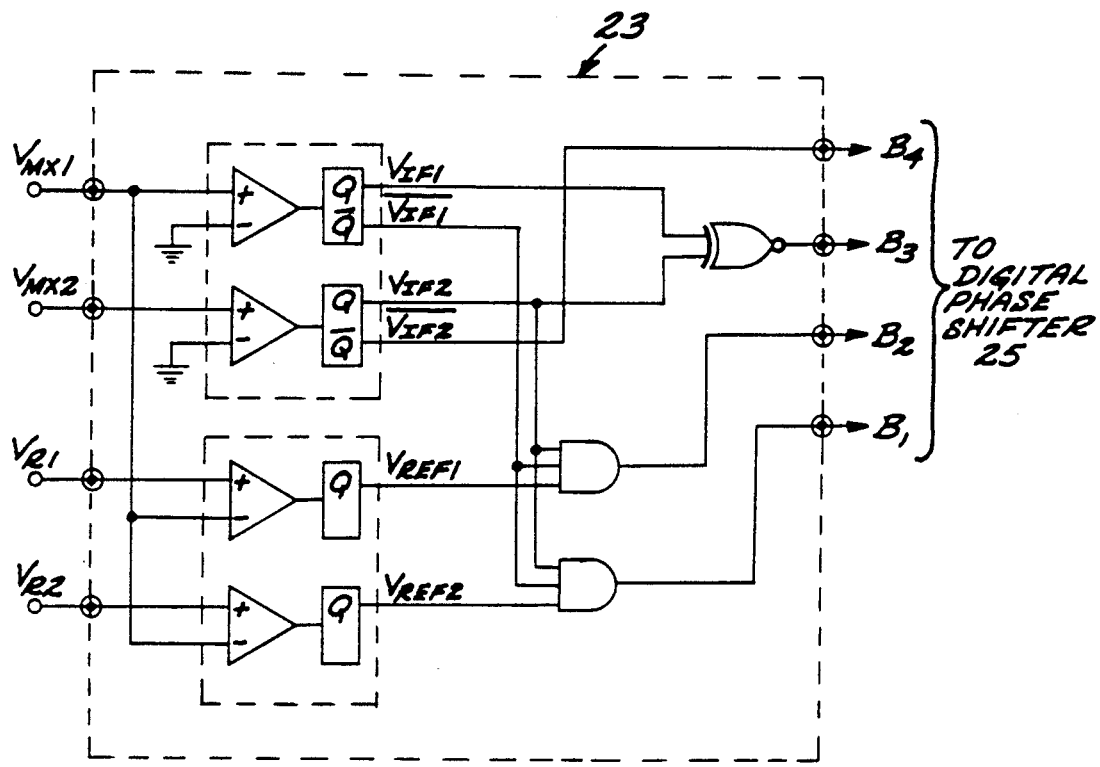
FIG. 4A is a logic diagram of the digital phase shifter control circuit of the noise control circuit in FIG. 1.

Thus, $V_{IF1}$ and $V_{IF2}$, derived from the outputs from mixers 59 and 57, can be used to control the digital phase controller 23 and digital phase shifter 25. Digital phase controller 23, illustrated in more detail at FIG. 4A, compares the two inputs from mixers 57 and 59, and determines within 90°, what the phase difference is between the signal from RF source 13 and the output from amplifier 11. In practice, the digital phase shifter 25 has four bit control and the bits for 90° and 180° are controlled by $V_{IF1}$ and $V_{IF2}$. $V_{REF1}$ and $V_{REF2}$ control the 45° and 22.5° bits to further lock the phase shift within 22.5°. This phase lockup happens when the $V_{IF1} = 0$ and $V_{IF2} = 1$ and only at this time, see Table II, line 4. After this, the analog phase shifter will correct for the remainder of the phase shift needed.

FIG. 4A illustrates an exemplary construction of digital phase controller 23. The inputs to controller 23 includes $V_{MX1}$ and $V_{MX2}$, the outputs from mixers 59 and 57, respectively, as well as $V_{R1}$ and $V_{R2}$, reference voltages that are provided external to digital controller 23. In practice, $V_{R1}$ and $V_{R2}$ are sinusoidal signals 22.5° out-of-phase. A truth table showing the outputs of digital phase controller 23 in response to the various inputs is set forth in Table III.

TABLE III

| $V_{IF1}$ | $V_{IF2}$ | $V_{REF1}$ | $V_{REF2}$ | $B_4$ (180°) | $B_3$ (90°) | $B_2$ (45°) | $B_1$ (22.5°) |
|---|---|---|---|---|---|---|---|
| 0 | 0 | 0 | 0 | 1 | 1 | 0 | 0 |
| 1 | 0 | 0 | 0 | 1 | 0 | 0 | 0 |
| 1 | 1 | 0 | 0 | 0 | 1 | 0 | 0 |
| 0 | 1 | 0 | 0 | 0 | 0 | 0 | 0 |
| 0 | 1 | 0 | 1 | 0 | 0 | 0 | 1 |
| 0 | 1 | 1 | 1 | 0 | 0 | 1 | 1 |
| 0 | 1 | 1 | 0 | 0 | 0 | 1 | 0 |

According to Table III, the following logic functions can be obtained for the four bit control signals communicated from digital phase controller 23 to digital phase shifter 25.

$B_4 = V_{IF2}$ $\quad B_2 = V_{REF1}$ $B_3 = \overline{V_{IF1}} V_{IF2} + V_{IF1} \overline{V_{IF2}}$ $\quad B_1 = V_{REF2}$ Analog phase shifter 26 may typically have a dynamic range of approximately 90°, but may be constructed to have only a 22.5° range, or less, in view of the function of the digital phase shifter 25. The more limited operating range is permitted because the phase shift can be reduced to within 22.5° by the digital phase shifter 25, leaving the analog phase shifter 26 to fine tune the phase shift of the input signal further beyond the 22.5° resolution.

Figure 4B:
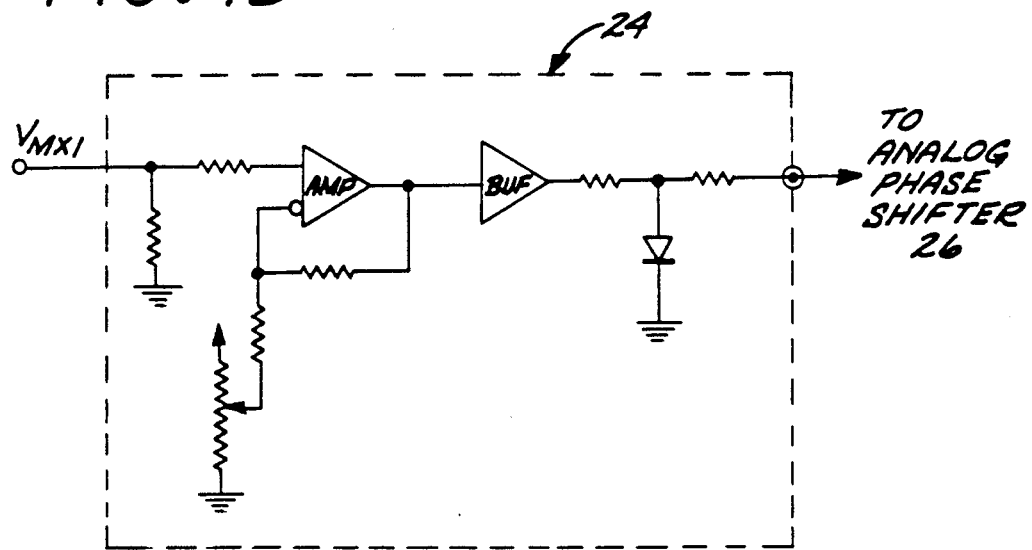
FIG. 4B is a schematic diagram for the analog phase shifter control circuit of the noise control circuit in FIG. 1.

An exemplary embodiment of analog phase controller 24 is provided in FIG. 4B. As shown therein, the output from mixer 59 ($V_{MX1}$) is input to controller 24, amplified to bring the signal up to levels adequate to drive the analog phase shifter, and preferably is amplified to a sufficient level to place analog phase shifter 26 approximately in the middle of its dynamic range. The amplified signal is then passed through a buffer and clamping diode and is then communicated to analog phase shifter 26.

AM noise reduction circuit 20 is illustrated in FIGS. 1 and 2. An exemplary circuit 59, implementing amplitude modulation controller 28, is set forth in more detail in FIG. 3. AM noise reduction circuit 20 is typically a leveling circuit that detects the amplitude modulation in the output of amplifier 11, and provides negative feedback to the analog attenuator 29 which in turn, generates a control signal that regulates the operation of analog attenuator 28.

The output of AM noise detector 27 is AC coupled to AM noise controller 28, such that only the AM noise component, independent of the RF level, is processed by AM noise controller 28. Within AM noise controller 28, the AM noise is amplified by an amplifier having the necessary gain and bandwidth to generate a signal that may control analog attenuator 29. AM noise controller circuit 28 further includes a buffer and current limiting resistor that drive the analog attenuator 29 to a proper level to cancel out the AM noise in the signal from the RF source 13 to amplifier 11.

Amplifier Compensation Circuit

The output of the amplifier 11 generally behaves as a logarithmic function of input as the amplifier approaches saturation. When the amplifier is in saturation, the input signal to the amplifier may vary while the output signal remains at a constant level. This saturation condition is limited to certain ranges of power input. Power input levels greater or less than those falling within a certain range will cause the amplifier output to be outside of the saturation region. Consequently, while monitoring the output power provides an indication of whether or not the amplifier 11 is in saturation, greater sensitivity is provided by monitoring the differential gain of the amplifier, which may vary even while the amplifier remains in saturation. Accordingly, the present invention monitors the differential gain of the amplifier, and controls the amount of feedback power that is fed back to the input of the amplifier in response to the monitored gain.

Figure 6A:
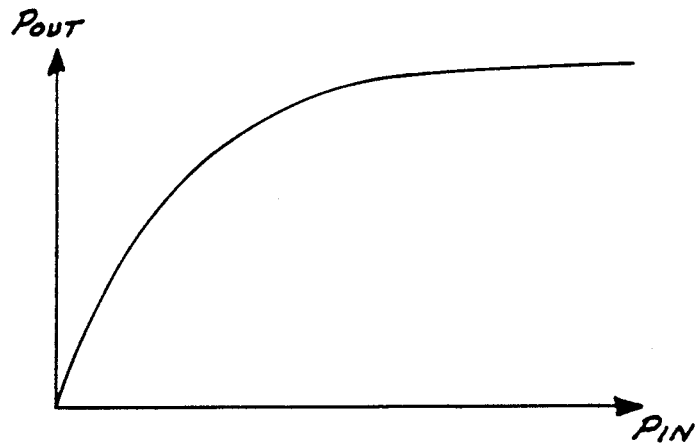
FIG. 6A is a graphical representation of a portion of the amplifier gain curve without gain compensation.
Figure 6B:
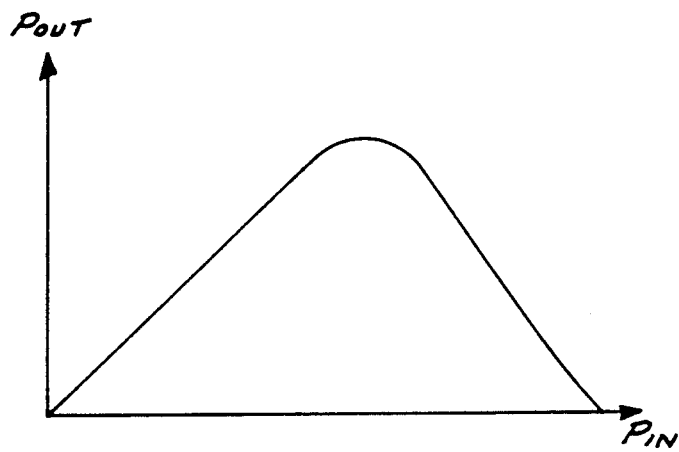
FIG. 6B is a graphical representation of a portion of the amplifier gain curve with the inclusion of gain compensation in accordance with the present invention.

FIG. 6A represents the normal amplifier gain curve that illustrates an exemplary relationship between the input and output power of amplifier 11. FIG. 6B is a modified representation of the same relationship which can be implemented for power control. The present invention compensates for the normal gain characteristics of the amplifier so as to increase the feedback power when the gain of the amplifier starts to drop off. Thus, the gain curve of the amplifier, incorporating the present invention, begins to approach the curve illustrated at FIG. 6B.

FIG. 5 illustrates a portion of the control circuit illustrated at FIG. 1, with further details of an exemplary attenuation control circuit 47. Attenuation control circuit 47 receives inputs from detectors 42 and 44, which sample the input and output signals from amplifier 11, respectively. In general, the attenuation control circuit 47 operates to detect and scale down the output of the amplifier 11 to approximately the same size as a signal detected from the input of amplifier 11. Comparison of the output and input to the amplifier provides an indication of the amplifier dynamic gain characteristic. The output of the comparison circuit is inverted by a unity gain inverting amplifier, to control the analog attenuation of the positive feedback signal.

The amount of attenuation, accomplished by detectors 42 and 44 will determine the gain relationship of the ratio detector and thus control the amount of positive feedback affected by the circuit. In practice, the amount of attenuation affected by detectors 42 and 44 may be predetermined based upon the anticipated operating characteristics of the amplifier 11, or may be dithered using well-known techniques such that the amount of positive feedback may be varied until the circuit arrives at the highest possible gain, and then stabilized at the corresponding positive feedback level.

Accordingly, attenuation of the compensation circuit may be preset by reference to amplifier specifications, experimental determination, or dithering of the compensation circuit signal levels. Where the attenuation levels are set in accordance with amplifier specifications, the attenuation is preferably set to a level corresponding to slightly less than the maximum anticipated gain of the amplifier. The signals from detectors 42 and 44 are communicated to a ratio detector which generates a signal representative of the gain of amplifier in relation to the reference. That signal is then communicated to an operational amplifier that compares the signal to a predetermined level representative of the non-oscillating gain limitation of the feedback loop. Depending upon the relationship between the gain and the predetermined level, the attenuation control circuit 47 communicates a signal to analog attenuator 43, which controls the attenuation of the positive feedback to the input of amplifier 11. Analog attenuator 43 is operated to incrementally vary the attenuation of the portion of the power output signal being fed back to the input of the amplifier in response to the attenuation control signal output from attenuation control 47. The amplitude of such incremental variations is dependent upon the gain characteristics of the amplifier, and the duration of such increments is dependent upon the loop transit time. Dithering of the attenuation of the amplifier gain compensation circuit can take place a different locations in the circuit utilizing techniques well known in the art, and permits the present invention to adaptively determine the correct attenuation level to maintain the amplifier in saturation despite variation in amplifier gain or other operating conditions.

The attenuation control circuit 41 consequently compares signals derived from the input and output of the amplifier 11, and uses the resulting gain indication to control the analog attenuator 43 in the positive feedback loop 50. The attenuation control circuit 41 controls the feedback power level to the amplifier 11 and maintains the loop gain at less than the unity gain limitation of the feedback loop at all times, i.e., less than a level that induces oscillation in the amplifier circuit.

As previously mentioned, the amplifier output lags behind the amplifier input due to time delay inherent in the amplifier itself. Consequently, during each pulse rise time, as amplifier output power increases, amplifier gain begins to decrease. Attenuation control circuit 41 senses that transient gain condition via the output of the ratio detector and, in response, must dynamically increase the feedback power level during the pulse rise to provide sufficient RF drive to saturate the amplifier. During the trailing edge of the pulse, as output power drops and amplifier gain increases, the feedback power level is correspondingly decreased to maintain a non-oscillating condition. Consequently, the present invention permits amplifier saturation to be automatically acquired on a pulse-to-pulse basis without external command or control.

In order to accommodate RF pulse rise and fall times of approximately 100 ns, it is anticipated that the attenuation control circuit 41 must have a nominal 10 MHz bandwidth. However, to accommodate RF pulse rise and fall times of approximately 50 ns, the attenuation control circuit 41 should preferably have a 20 to 30 MHz bandwidth, with minimum propagation delay.

Additionally, the attenuation of the amplifier RF attributable to the positive feedback circuit must be taken into account because that attenuation will directly affect the desired feedback level. The same care must be exercised in sampling the amplifier input. As one skilled in the art will recognize, the feedback circuit 50 is also sensitive to the equivalent length of loop, i.e., the loop transit time, as well as drift in the gain of components in the feedback loop. Thus, the attenuation and phase adjustment circuit should be designed to accommodate those characteristics of the particular implementation.

RF Power Control Circuit 111

When a low level of input power is applied to the amplifier, it takes a number of feedback cycles through the feedback loop to build up the desired power level at the output of the amplifier. During this period of power build-up, the gain compensation circuit insures that the loop gain stays below unity, and therefore prevents oscillation. After the output power of the amplifier increases to the point where it begins to compress, the amplifier gain begins to decrease. When this starts to happen, the gain compensation circuit gives the system "credit" for this reduction in gain and compensates by reducing the loop attenuation. The decrease in loop attenuation causes the amplifier to operate further into compression which reduces the gain even more. This cycle continues until the minimum loop attenuation is reached. The main advantage of this scheme is that the maximum possible power is fed back to combine with the RF input power, thereby permitting system operation with minimal RF input power. The net gain of the system is therefore maximized.

The process, described above, is beneficial until it causes the amplifier to be overdriven. The output power verses input power ($P_{out}$ vs. $P_{in}$) curve for an amplifier 11 comprising a solid state power amplifier is as shown in FIG. 6A. The large signal gain at any point on the curve is the slope of the line which that point to the origin. It can be seen that the gain continues to decrease as the input power increases. As the gain decreases, the gain compensation circuit causes the input power to increase more. If this process is allowed to continue, the amplifier can be damaged. This problem was solved by designing the RF power control circuit 111, as shown in FIG. 1. The circuit operates by detecting the input power of the amplifier. When the input power exceeds a predetermined level, the detector causes the PIN driver circuit to apply a current to the PIN attenuator, which decreases the input power to the amplifier. When this happens, the gain compensation circuit senses an apparent increase in loop gain and increases the attenuation in the feedback loop. The increased attenuation causes the input power of the amplifier to decrease thereby causing the PIN attenuator in the RF power control circuit to decrease its attenuation. The net effect is that an equilibrium point is reached.

The Pout vs. Pin curve for a solid state amplifier with an RF power control circuit is shown in FIG. 6B. The circuit can be adjusted so that the amplifier reaches its equilibrium point at the maximum of the curve.

Figure 7:
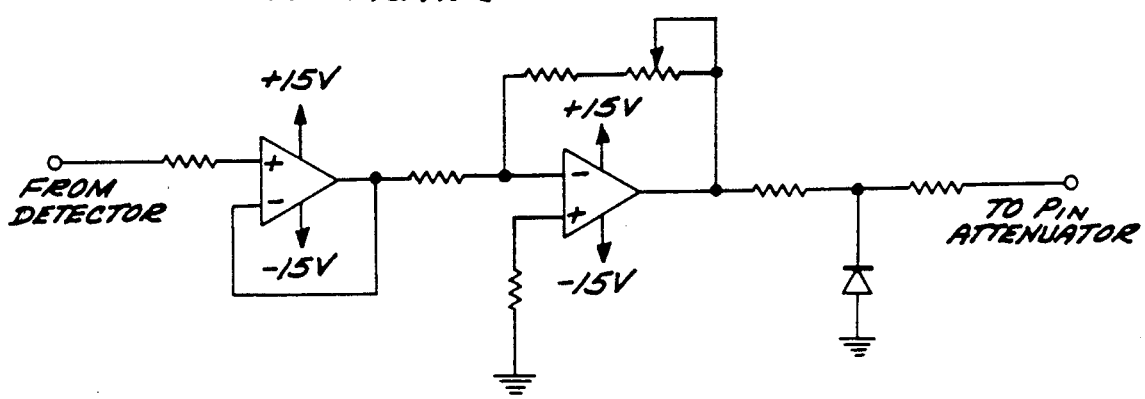
FIG. 7 is a schematic diagram of a portion of the circuitry of FIG. 1, further detailing the PIN driver in the RF power control circuit.

By way of illustrative example, a schematic of the PIN driver is shown in FIG. 7.

Phase Control of the Feedback

In addition to controlling the loop gain, the phase of the feedback signal must also be controlled to insure that the positive feedback signal is combined in phase with the input RF signal. Such control reduces the phase noise that otherwise would be repetitively amplified by the amplifier, resulting in degraded transmitter noise performance. The feedback phase control circuit compares the phases of the input and RF, and RF feedback signals. It then commands a four bit digital phase shifter and an analog phase shifter to vary the phase of the RF feedback signal so that it is combined in phase with the RF signal input to provide the drive augmentation the amplifier.

Phase control circuit 31, shown at FIG. 1, operates the phase match the input and the feedback signals to the amplifier 11. Such phase matching is essential considering the noise impact on the system, and effects the exact power ratio between the input and feedback signals. Phase control circuit 31 includes phase modulation detector 32, analog phase shifter 33, and analog phase shift controller 37, digital phase shifter 35, and digital phase shift controller 39. Phase control circuit 31 is effective to adjust the phase of the positive feedback signal to conform to the phase of the signal from RF source 13 input the amplifier 11. Limiting amplifiers at the mixer input prevent amplitude variations from distorting the phase difference signal. The mixer outputs drive high-speed ECL III circuits that drive a four bit digital phase shifter and an analog phase shifter to vary the phase of the RF feedback signal, so that it is maintained in phase with the exciter drive signal. The particular technique and circuitry utilized to implement the functions of phase control circuit 31 can be similar to that utilized in connection with noise control circuit 21, with the exception that the phase control circuit operates in a positive feedback mode. However, for improved operation, particular circuits for the analog phase shift controller 37 and the digital phase shift controller 39 are set forth by way of illustrative examples in FIGS. 8 and 9, which are discussed in further detail below.

As discussed in connection with noise control circuit 21, the phase control circuit 31 reduces the noise that would otherwise be repetitively amplified by the amplifier 11, resulting in degraded transmitter noise performance. The phase control circuit 31 compares the phases of the input and RF feedback signals and commands a four bit digital phase shifter 35 along with an analog phase shifter 33 to vary the phase of the feedback signal so that the feedback signal is combined in phase with the RF input to provide positive drive augmentation to amplifier 11.

Analog Phase Shift Controller 37 (FIG. 8.)

The analog phase shift controller 37 includes a voltage follower for buffering the output from the phase detector 32 which is sensitive to loading and has limited current drive capability. The output of the voltage follower is then amplified by an operational amplifier thereby producing the desired output voltage swing. The output of the operational amplifier is sent to a comparator where it is compared to an adjustable set voltage. The comparator's output is integrated and used to control the analog phase shifter.

As the phase of the inputs to the detector 32 change with respect to each other, the input voltage to the comparator will change until it crosses the set voltage level. At this point, the comparator's output voltage will change polarity which will cause the integrator's output voltage to change. The circuit is designed so that the integrator's output voltage will change in a direction that causes the analog phase shifter to shift its phase until the amplified phase detector voltage equals the set voltage on the comparator. In this way, the loop provides a restoring action such that the phase difference between the two RF inputs to the phase detector is held constant.

The phase relationship between the two signals can be set by adjusting the set voltage on the comparator. The set voltage is adjusted until the amplifier reaches its maximum output power.

The resistor-diode network at the output of the integrator is used to prevent a voltage of the wrong polarity from being applied to the phase shifter. In addition, the network serves as a current limiting resistor in case the phase shifter input becomes shorted.

The two diodes at the input of the analog phase shift controller 37 are used to provide protection in case a potentially damaging voltage becomes present at the voltage follower.

Digital Phase Shift Controller 39 (FIG. 9)

The phase compensation circuit depends on the digital phase shifter to compensate the phase so that it is within range for the analog phase shifter. The digital phase shift controller was designed so that any time the analog phase shifter is out of range the digital phase shifter changes until the analog phase shifter comes back into range. This is accomplished by monitoring the control voltage of the analog phase shift controller with a window comparator. The window comparator is set so that, when the control voltage is less than a specified minimum or greater than a specified maximum, the output of the window comparator triggers to a different voltage state. The change in voltage causes a binary counter to start counting. The output of the binary counter controls a digital phase shifter. The counter counts until the appropriate phase shift is achieved to allow the analog phase compensation circuit to acquire phase-lock. When phase-lock is acquired, the analog phase shifter voltage is inside the window comparator's voltage window. This causes the window comparator to stop the counter at its current count. The proper phase shift to acquire lock is therefore maintained.

The direction of the count is determined by which limit the analog phase shifter has reached. If the analog phase shifter control voltage is at its lower limit then the counter counts down. If the voltage is at its upper limit then the counter counts up. In this way the digital phase shifter is always shifted in the correct direction to compensate the phase. The direction of the count is determined by a comparator before the count even begins. If the analog phase shifter control voltage goes below the midpoint of the lock range then the comparator output switches to a voltage that sets the counter to count down. If the control voltage exceeds the midpoint of the lock range then the counter gets set to count up. In this way, the counter is always prepared to count in the proper direction.

The foregoing has been a disclosure of a positive feedback control circuit for an amplifier which prevents the amplifier from being overdriven and which is advantageously utilized in applications where it is desirable to drive an amplifier into compression, for example, in a radar transmitter to achieve maximum pulsed output power or to maintain relatively constant power output in spite of minor amplitude variations in the RF source signal.

As previously discussed, various modifications, additions and substitutions may be effected to implement the structure and function of the component portions without departing from the spirit and scope of the invention.

For example, other circuitry for effecting gain regulated feedback or augmenting the amplifier drive with a portion of the amplifier output are anticipated within the scope of the invention. Additionally, the present invention may have application in amplifiers other than solid state power amplifiers.

What is claimed is:

1. A drive control circuit for an amplifier comprising:
   a power combiner for combining an RF input signal with a feedback signal to provide a composite RF signal;
   power control means responsive to said composite RF signal for providing to the input of the amplifier a selectively attenuated replica of said composite RF signal, said power control means selectively attenuating said composite RF signal when the power of said composite RF signal exceeds a predetermined threshold;
   feedback means connected between the output of the amplifier and said power combiner for providing a portion of the output of the amplifier as said feedback signal; and
   feedback attenuator means for controlling the level of said feedback signal provided to said power combiner as a function of the gain as determined by the level of said composite RF signal and the level of the amplifier output, said feedback signal being increasingly attenuated with increasing gain.

2. A drive control circuit for an amplifier comprising:
   a power combiner for combining an RF input signal with a feedback signal to provide a composite RF signal;
   power control means responsive to said composite RF signal for providing to the input of the amplifier a selectively attenuated replica of said composite RF signal when the amplifier is operating in a compression mode wherein the gain of the amplifier decreases with increasing input power;
   feedback means connected between the output of the amplifier and said power combiner for providing a portion of the output of the amplifier as said feedback signal; and
   feedback attenuator means for controlling the level of said feedback signal provided to said power combiner as a function of the gain as determined by the level of said composite RF signal and the level of the amplifier output, said feedback signal being increasingly attenuated with increasing gain.

3. An amplifier feedback phase control circuit for controlling the phase of a feedback signal relative to the input to the amplifier, the phase control circuit comprising:
   phase comparing means for comparing the phase between the input to the amplifier and the feedback signal;
   first control means responsive to said phase comparing means for providing a first phase control signal;
   analog phase shift means responsive to said first phase control means for shifting the phase of the feedback signal in response to said first control signal;
   comparison means responsive to said first phase control signal for providing a window comparison signal indicative of whether the level of said first phase control signal is outside a predetermined range and for providing a comparison signal indicative of whether said first phase control signal is above or below a predetermined level within said predetermined range;

counting means responsive to said window comparison signal and said comparison signal, and being enabled to count when said window comparison signal indicates that said first phase control signal is outside said predetermined range, the count direction being determined by said comparison signal, whereby the count direction is set before the counting means is enabled; and digital phase shifting means responsive to said counting means for shifting the phase of the feedback signal.

* * * * *